(12) United States Patent
Chou et al.

(10) Patent No.: US 7,612,605 B2
(45) Date of Patent: Nov. 3, 2009

(54) BOOTSTRAP VOLTAGE GENERATING CIRCUITS

(75) Inventors: Shao-Yu Chou, Chung-Li (TW); Yen-Huei Chen, Hsin-Chu (TW); Jui-Jen Wu, Hsin-Chu (TW); Gary Chan, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 113 days.

(21) Appl. No.: 11/705,642

(22) Filed: Feb. 12, 2007

(65) Prior Publication Data

US 2008/0191798 A1 Aug. 14, 2008

(51) Int. Cl.
*G05F 1/10* (2006.01)
*G05F 3/02* (2006.01)

(52) U.S. Cl. ..................... 327/536
(58) Field of Classification Search ................. 327/536, 327/541; 363/59–60
See application file for complete search history.

(56) References Cited

U.S. PATENT DOCUMENTS

| | | | |
|---|---|---|---|
| 5,675,280 A | * | 10/1997 | Nomura et al. ............. 327/538 |
| 5,825,217 A | | 10/1998 | Lehavot |
| 6,127,881 A | * | 10/2000 | Tsay et al. .................. 327/538 |
| 6,271,715 B1 | | 8/2001 | Pinchback et al. |
| 6,400,211 B1 | * | 6/2002 | Yokomizo et al. ........... 327/536 |
| 7,138,853 B2 | * | 11/2006 | Kim et al. ................... 327/536 |
| 7,233,508 B2 | * | 6/2007 | Itoh ............................. 363/60 |
| 7,368,978 B2 | * | 5/2008 | Holland ...................... 327/536 |
| 7,382,177 B2 | * | 6/2008 | Cordoba et al. ............. 327/536 |
| 2003/0085754 A1 | * | 5/2003 | Lim ............................ 327/540 |
| 2005/0104651 A1 | * | 5/2005 | Hashimoto .................. 327/536 |

* cited by examiner

*Primary Examiner*—Quan Tra
(74) *Attorney, Agent, or Firm*—Slater & Matsil, L.L.P.

(57) ABSTRACT

A bootstrap voltage generating circuit includes a bias circuit having a first end coupled to a first power source node having an operation voltage, and a second end coupled to a low voltage reference potential, wherein a voltage at the first end is related to the operation voltage in a non-linear way; a charging capacitor having a first end coupled to the load circuit; a charging path between a second end of the charging capacitor and the first end of the bias circuit, wherein the charging path is responsive to a clock signal; a discharging path between the second end of the charging capacitor and the low voltage reference potential, wherein the discharging path is responsive to the clock signal; and a switch circuit connected to the first end of the charging capacitor for setting a voltage thereon, wherein the switch circuit is responsive to the clock signal.

13 Claims, 4 Drawing Sheets

BOOTSTRAP VOLTAGE GENERATING CIRCUITS

TECHNICAL FIELD

This invention relates generally to integrated circuits, and more particularly to bootstrap voltage generators.

BACKGROUND

Integrated circuits are typically formed on semiconductor chips. The integrated circuits on a semiconductor chip are powered by a power supply for providing an operation voltage, often referred to as voltage-drain-drain (VDD). Therefore, the voltages in the integrated circuits are typically in the range of between a ground voltage of 0V and the operation voltage VDD.

In order to improve the reliability and performance of integrated circuits, voltages outside the typical voltage range, either higher than operation voltage VDD, or lower than ground voltage of 0V, may be needed. Exemplary circuits having such a requirement include static random access memory (SRAM) cells operated under dynamic powers. By applying voltages lower than 0V or higher than operation voltage VDD on SRAM cells, the read and write margins of the SRAM cells can be improved.

FIG. 1 illustrates a conventional bootstrap voltage generating circuit, which includes a p-type metal-oxide-semiconductor (PMOS) transistor 2 serially coupled to an n-type metal-oxide-semiconductor (NMOS) transistor 4. PMOS transistor 2 and NMOS transistor 4 are coupled between the ground and operational voltage VDD, and form an inverter, so that voltage V8 at node 8 has an inversed phase compared with voltage V6 at node 6. Capacitor 10 is coupled in series with load capacitor 12, which may be an equivalent capacitor of a load circuit.

The voltage at node 6 is a clock signal switching between 0V and operation VDD. When voltage V6 rises from 0V to VDD, voltage V8 falls from VDD to 0V. Accordingly, voltage V14 at node 14 falls from an initial voltage V1 to a lower voltage V2. If V1 is set to 0V, V2 will be lower than 0V, and there is the relationship:

$$V2=-VDD*C12/(C10+C12) \quad [\text{Eq. 1}]$$

wherein C10 and C12 are the capacitances of capacitors 10 and 12, respectively. A bootstrap voltage lower than the ground voltage is thus generated.

The circuit shown in FIG. 1 can also be used to generate a voltage higher than VDD. When voltage V6 falls from operation voltage VDD to 0V, voltage V8 rises from 0V to operation voltage VDD. Accordingly, voltage V14 at node 14 increases from an initial voltage V3 to a higher voltage V4. If V3 is set to VDD, V4 will be higher than VDD, and there is the relationship:

$$V4=VDD*C12/(C10+C12)+VDD \quad [\text{Eq. 2}]$$

Equations 1 and 2 indicate that the bootstrap voltages V2 and V4 are linearly related to operation voltage VDD. Such bootstrap voltages suffer limitations. For example, if the performance of the load circuits shifts with the change in temperature, it is desired that bootstrap voltages also shift with the temperature in order to cancel the shift effects of the load circuit. Such a function, however, cannot be provided by conventional bootstrap voltage generating circuits. Accordingly, more flexible bootstrap voltage generating circuits are needed.

SUMMARY OF THE INVENTION

In accordance with one aspect of the present invention, a bootstrap voltage generating circuit for generating a bootstrap voltage on a load circuit having a load capacitance is provided. The bootstrap voltage generating circuit includes a bias circuit having a first end coupled to a first power source node having an operation voltage, and a second end coupled to a low voltage reference potential, wherein a voltage at the first end is related to the operation voltage in a non-linear way; a charging capacitor having a first end coupled to the load circuit; a charging path between a second end of the charging capacitor and the first end of the bias circuit, wherein the charging path is responsive to a clock signal; a discharging path between the second end of the charging capacitor and the low voltage reference potential, wherein the discharging path is responsive to the clock signal; and a switch circuit connected to the first end of the charging capacitor for setting a voltage thereon, wherein the switch circuit is responsive to the clock signal.

In accordance with another aspect of the present invention, the bootstrap voltage generating circuit includes a current source providing a current; a bias circuit receiving the current, wherein the bias circuit has a first end, and a second end connected to a low voltage reference potential, and wherein a voltage at the first end of the bias circuit is independent from a drift of a power supply voltage of the bootstrap voltage generating circuit; a charging capacitor having a first end coupled to the load circuit; a charging path between a second end of the charging capacitor and the first end of the bias circuit, wherein the charging path is responsive to a clock signal; a discharging path between the second end of the charging capacitor and a reference potential, wherein the discharging path is responsive to the clock signal; and a switch circuit connected to the first end of the charging capacitor for setting a voltage at the first end of the charging capacitor, wherein the switch circuit is responsive to the clock signal.

In accordance with yet another aspect of the present invention, a bootstrap voltage generating circuit includes a current source for providing a current; a bias circuit receiving the current, wherein the bias circuit has a first end, and a second end connected to a reference potential, and wherein a voltage at the first end of the bias voltage is a function of a resistance of a resistive device; a PMOS transistor having a source coupled to the first end of the bias circuit; an NMOS transistor having a drain connected to a drain of the PMOS transistor, and a gate connected to a gate of the PMOS transistor, wherein the gates of the PMOS transistor and the NMOS transistor are coupled to a clock signal; a charging capacitor having a first end coupled to the drains of the PMOS transistor and the NMOS transistor and a second end coupled to the load circuit; and a switch circuit connected to a second end of the charging capacitor for setting a voltage at the second end of the charging capacitor, wherein the switch circuit is responsive to the clock signal.

The embodiments of the present invention have the advantageous features of being non-linearly correlated to the power supply voltage, and thus provide more design flexibilities.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel bootstrap voltage generating circuit is provided. The variations and operation of the preferred embodiments are then discussed. Throughout the various views and illustrative embodiments of the present invention, like reference notations are used to designate like elements.

Figure 1:
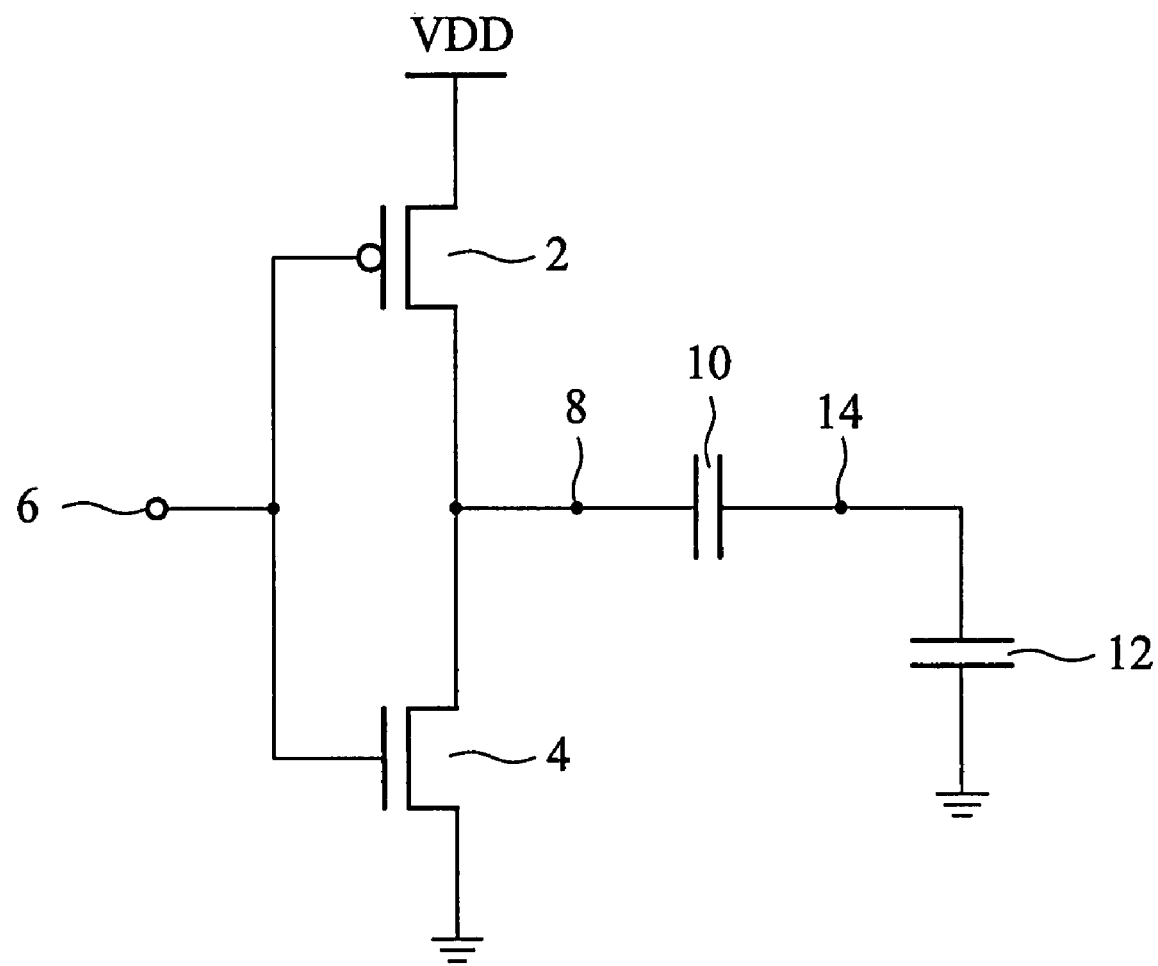
FIG. 1 illustrates a conventional bootstrap voltage generating circuit, wherein a generated bootstrap voltage is linearly proportional to operation voltage VDD.
Figure 2:
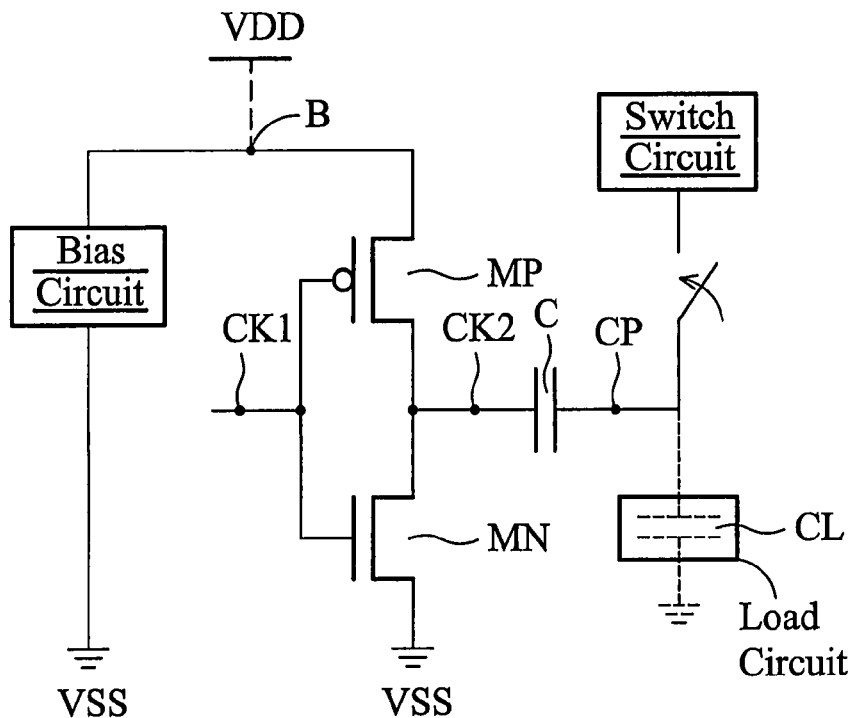
FIG. 2 illustrates an embodiment of the present invention, wherein a generated bootstrap voltage is not linearly correlated to operation voltage VDD.

FIG. 2 illustrates a schematic circuit diagram of a bootstrap voltage generating circuit, which includes a bias circuit coupled between operation voltage VDD and a low voltage reference potential VSS. Operation voltage VDD is also referred to as a power supply voltage VDD. Reference potential VSS is often set as 0V (grounded), although it may be set at a higher or a lower voltage. The bias circuit may be a simple device, such as a resistor, a diode, a metal-oxide-semiconductor (MOS) transistor, or a circuit comprising a plurality of devices. Voltage Vo is generated at node B of the bias circuit. An inverter including PMOS transistor MP and NMOS transistor MN are coupled in parallel with the bias circuit, and thus voltage Vo is applied on the inverter. The bootstrap voltage generating circuit further includes a charging capacitor C (with a capacitance also denoted as C) and a load circuit having load capacitance CL, wherein load capacitance CL is the equivalent capacitance of the load circuit. Additional capacitors may be built in the load circuit to adjust the load capacitance CL to a desired value. A clock signal, which switches between a high voltage and a low voltage, for example, between power supply voltage VDD and reference potential VSS, is applied on node CK1, which is connected to the gates of transistors MP and MN. As a result, a bootstrap voltage VCP is generated at node CP.

The bootstrap voltage generating circuit further includes a switch circuit, which is capable of connecting node CP to desired voltages at desired times of the clock signal. For example, for producing a bootstrap voltage lower than VSS, the switch circuit connects node CP to the ground when node CK1 is at a low voltage, and disconnects node CP from the ground before the voltage VCK1 at node CK1 starts rising. Conversely, for producing a bootstrap voltage higher than operation voltage VDD, the switch circuit connects node CP to operation voltage VDD when node CK1 is at a high voltage, and disconnects node CP from operation voltage VDD before the voltage VCK1 at node CK1 starts falling.

The bias circuit has the function of generating bias voltage Vo at node B. In the preferred embodiment, voltage Vo is correlated to operation voltage VDD in a non-linear way, which may be either non-linearly correlated to operation voltage VDD, or independent from voltage VDD. Apparently, voltage Vo is lower than operation voltage VDD. In an exemplary embodiment, voltage Vo may be a function of temperature, or a function of a threshold voltage of a MOS transistor. Conversely, voltage Vo may be free from the effect of temperatures or the threshold voltages of MOS transistors. In other exemplary embodiments, voltage Vo is a constant voltage that does no change with the variation of operation voltage VDD. Since voltage Vo is correlated to operation voltage VDD in a non-linear way, if operation voltage VDD drifts up or down, voltage Vo will not drift linearly with the drift of operation voltage VDD, if voltage Vo drifts at all.

Figure 3:
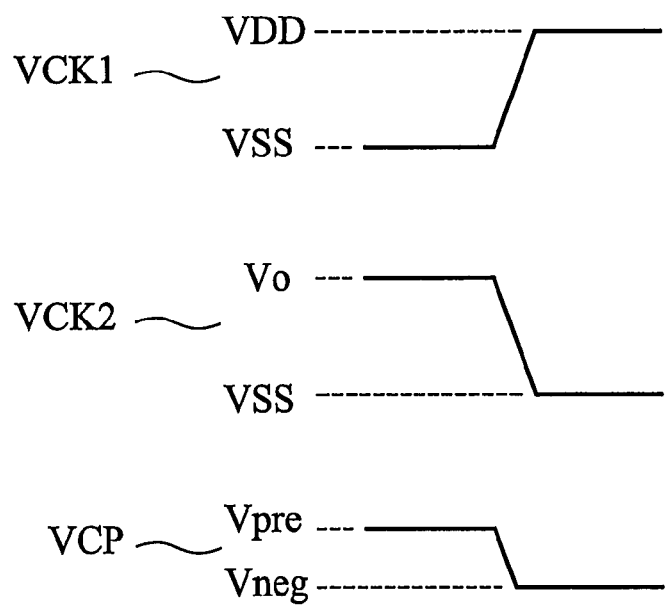
FIGS. 3 and 4 illustrate voltages at different nodes of the bootstrap voltage generating circuit.

The operations of the bootstrap voltage generating circuit shown in FIG. 2 are briefly described as follows. The following discussion is based on the assumption VSS is at 0V. One skilled in the art will be able to determine the operations even if VSS is not grounded. FIG. 3 illustrates voltages VCK1, VCK2 and VCP at respective nodes CK1, CK2 and CP as functions of time. At the beginning of a clock cycle, voltage VCK1 at node CK1 is low, and thus transistor MP is on and transistor MN is off. Voltage VCK2 at node CK2 is thus high with a voltage equal to Vo. Capacitors CL and C are thus charged. Assuming at the time the voltage at node CP is Vpre, which may be set by the switch circuit, the total charge Q1 at node CP can be derived as:

$$Q1 = Vpre*CL + (Vpre - Vo)*C \quad [Eq. 3]$$

The switch circuit is then disconnected from node CP. When signal voltage VCK1 at node CK1 rises to a high voltage, such as VDD, transistor MP is off and transistor MN is on. Voltage VCK2 at node CK2 thus falls to VSS, which may be 0V. Assuming now the voltage at node CP is Vneg, the total charge Q2 at node CP can be derived as:

$$Q2 = Vneg*CL + Vneg*C \quad [Eq. 4]$$

Since the charge at node CP stays the same before and after the inverter flips, Q1 is equal to Q2. Combining Equations 3 and 4, it is derived:

$$Vneg = Vpre - Vo*CL/(CL+C) \quad [Eq. 5]$$

Therefore, by setting voltage Vpre to 0V using the switch circuit, it is obtained:

$$Vneg = -Vo*CL/(CL+C) \quad [Eq. 6]$$

Since Vo is not linearly correlated to operation voltage VDD, bootstrap voltage Vneg is not linearly correlated to operation voltage VDD.

Figure 4:
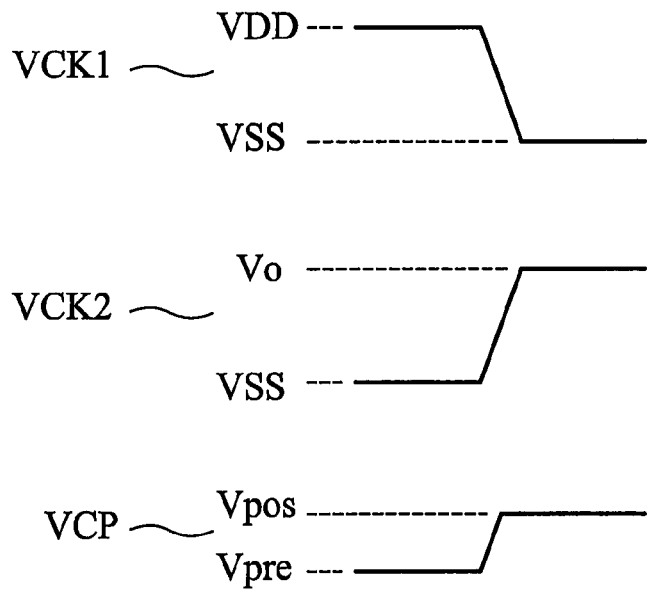

The circuit shown in FIG. 2 can also be used to generate a voltage higher than VDD. FIG. 4 illustrates the voltages VCK1, VCK2 and VCP as functions of time. In a clock cycle, voltage VCK1 at node CK1 switches from VDD to VSS, and thus voltage VCK2 at node CK2 switches from VSS to Vo. As a result, Voltage VCP at node CP increases from Vpre to Vpos, wherein voltage Vpre may be set to a desired value by the switch circuit. Using similar methods as for deriving Equations 3 through 5, voltage Vpos at node CP can be derived as:

$$Vpos = Vo*CL/(CL+C) + Vpre \quad [Eq. 7]$$

If Vpre is VDD, Vpos is higher than VDD, and the difference Vpos−Vpre is not linearly correlated to operation voltage VDD since voltage Vo is not linearly correlated to operation voltage VDD.

On a semiconductor chip, there may be a comprehensive bootstrap voltage generating circuit comprising a first bootstrap voltage generating circuit and a second bootstrap voltage generating circuit, both having structures in FIG. 2. The bias circuits (as well as the current source in FIGS. 5 though 7) of the first and the second bootstrap voltage generating circuits may be the same or different. The first bootstrap voltage generating circuit is used to generate a voltage higher than VDD, and the second bootstrap voltage generating circuit is used to generate a voltage lower than VSS. Accordingly, the switch circuit in the first bootstrap voltage generating circuit works differently from the switch circuit in the second bootstrap voltage generating circuit. Specifically, the switch circuit in the second bootstrap voltage generating circuit connects the respective node CP to VDD at a different time from the time the switch circuit in the first bootstrap voltage generating circuit connects the respective node CP to VSS.

Figure 5:
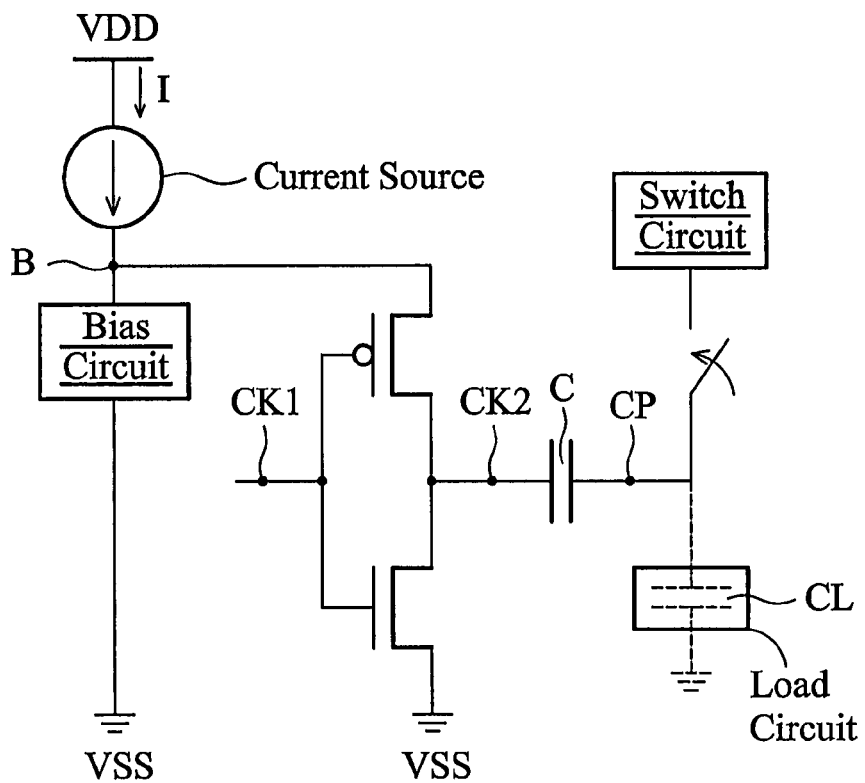
FIGS. 5 through 7 illustrate implementations of the embodiment shown in FIG. 2.

FIG. 5 illustrates an implementation of the circuit shown in FIG. 2, which includes a current source for providing current I. Assuming the bias circuit has an impedance of Rload, voltage Vo is thus determined by I*Rload, which may either be independent from operation voltage VDD if current I is a constant current, or non-linearly proportional to operation voltage VDD. In an exemplary embodiment, current I is provided by a constant current source, and the bias circuit is a resistor. Accordingly, even if operation voltage VDD drifts, voltage Vo at node B does not drift.

Figure 6:
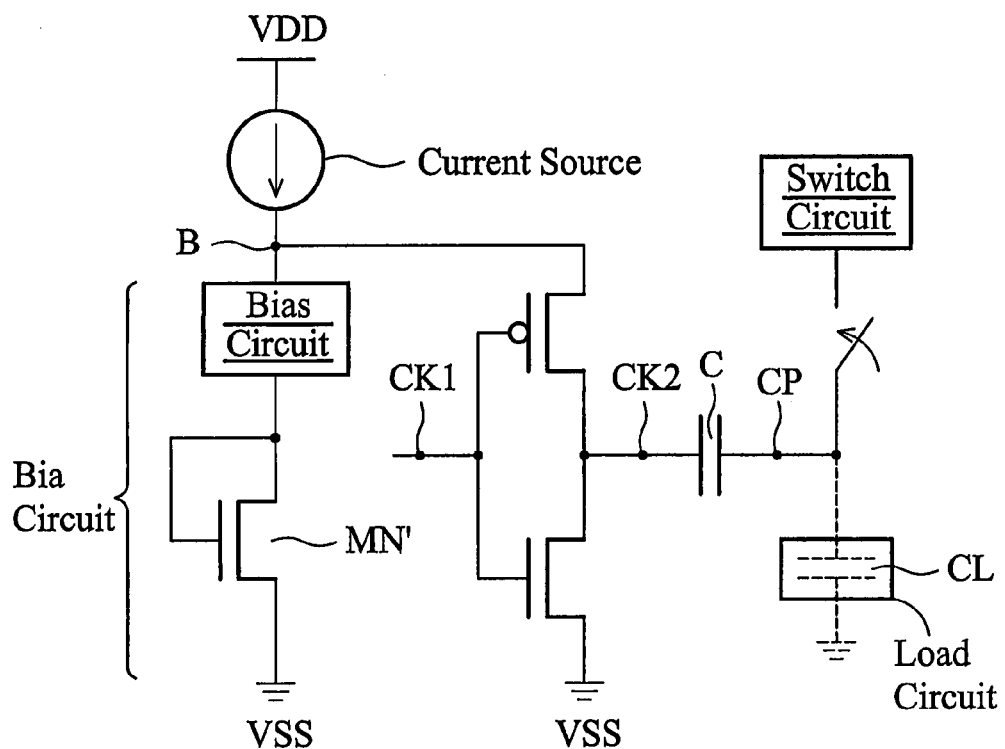

FIG. 6 illustrates a further implementation of the circuit shown in FIG. 2, wherein the bias circuit includes MOS transistor MN' and a serially coupled bias sub circuit. The drain and the gate of MOS transistor MN' is interconnected. The voltage at node 20 may thus be expressed as I*Rload'+Vt, wherein Vt is the threshold voltage of MOS transistor MN', and resistance Rload' is the resistance of the bias sub circuit, assuming the bias sub circuit is resistive. Equation 5 can thus be written as:

$$Vneg=Vpre-(I*Rload'+Vt)*CL/(CL+C) \qquad [Eq. 8]$$

An advantageous feature of the embodiment shown in FIG. 6 is that the bootstrap voltage Vneg tracks the variation of threshold voltage Vt. By designing MOS transistor MN' similar to the MOS transistors in the load circuit, the adverse effects caused by the shifts of the threshold voltage in the load circuit can be cancelled, at least partially. For example, if threshold voltage Vt of MOS transistors in the load circuit undesirably shifts up or down, the bootstrap voltage, which may be applied on the gates of the MOS transistors in the load circuit, is also shifted up or down, and thus the adverse effects caused by Vt shift are cancelled. Similar analysis using Equation 7 also reveals the similar results.

Figure 7:
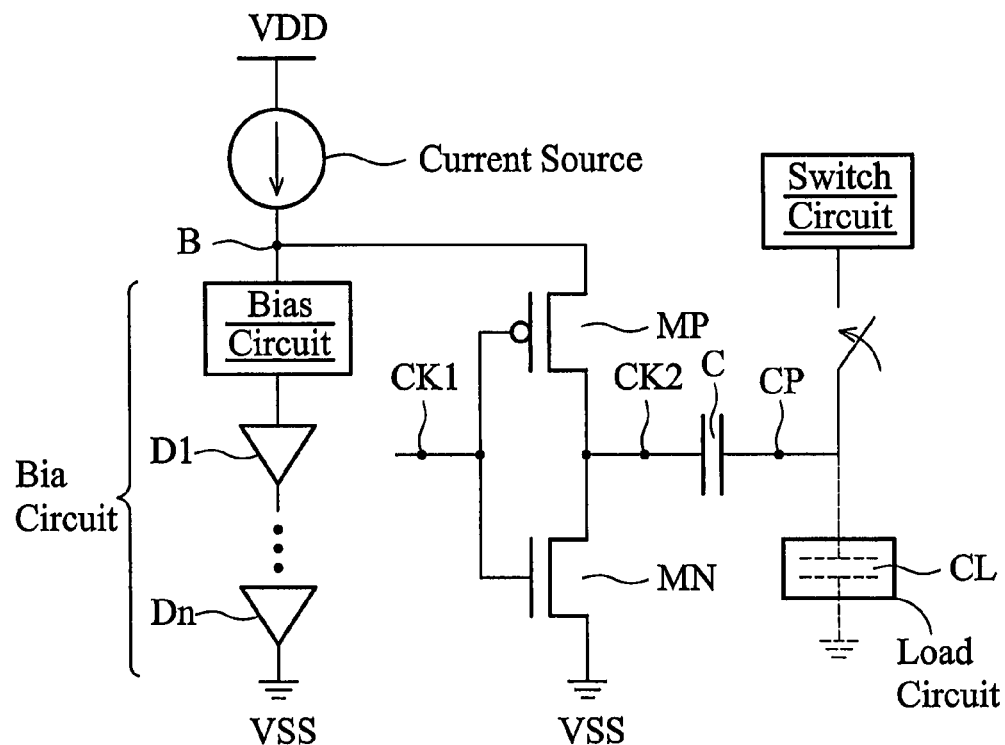

In alternative embodiments, the bootstrap voltages may track the temperatures. FIG. 7 illustrates an exemplary embodiment, wherein the bias circuit includes a plurality of diodes D1 through Dn coupled serially to the bias sub circuit, which has resistive characteristics. As is known in the art, if a diode is serially connected to a resistive electrical device, the voltage drop on the diode has a negative temperature coefficient. Accordingly, the generated bootstrap voltage has a negative temperature coefficient. The Equation of the bootstrap voltage may be expressed as:

$$Vpre-Vneg=(I*Rload'+Vdiodes)*CL/(CL+C) \qquad [Eq. 9]$$

wherein voltage Vdiodes is the voltage drop on diodes D1 through Dn, and having a negative temperature coefficient.

By decoupling bootstrap voltages from operation voltage VDD, the embodiments of the present invention provide significantly greater flexibility for circuit design.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A bootstrap voltage generating circuit for generating a bootstrap voltage on a load circuit having a load capacitance, wherein the bootstrap voltage generating circuit comprises:
   a bias circuit having a first end coupled to a first power source node having an operation voltage, and a second end coupled to a low voltage reference potential, wherein a voltage at the first end is related to the operation voltage in a non-linear way, and wherein the bias circuit comprises a diode;
   a charging capacitor having a first end coupled to the load circuit;
   a charging path between a second end of the charging capacitor and the first end of the bias circuit, wherein the charging path is responsive to a clock signal;
   a discharging path between the second end of the charging capacitor and the low voltage reference potential, wherein the discharging path is responsive to the clock signal; and
   a switch circuit connected to the first end of the charging capacitor for setting a voltage at the first end of the charging capacitor, wherein the switch circuit is responsive to the clock signal, and wherein the switch circuit is configured to control the bootstrap voltage generating circuit to output both a positive voltage and a negative voltage at the first end of the charging capacitor.

2. The bootstrap voltage generating circuit of claim 1, wherein the charging path comprises a PMOS transistor having a source connected to the first end of the bias circuit, the discharging path comprises an NMOS device having a source connected to the low voltage reference potential, wherein a drain of the PMOS transistor is connected to a drain of the NMOS transistor, and wherein a gate of the PMOS transistor and a gate of the NMOS transistor are connected to the clock signal.

3. The bootstrap voltage generating circuit of claim 1, wherein the first end of the bias circuit is at a constant voltage lower than the operation voltage, and wherein the constant voltage is independent from a variation in the operation voltage.

4. The bootstrap voltage generating circuit of claim 1, wherein the bias circuit comprises a resistive device, and wherein the voltage at the first end of the bias circuit is proportional to a resistance of the resistive device.

5. The bootstrap voltage generating circuit of claim 4, wherein the bias circuit further comprises an NMOS transistor serially coupled to the resistive device, wherein a gate and a drain of the NMOS device are interconnected.

6. The bootstrap voltage generating circuit of claim 1 further comprising a current source coupled between the operation voltage and the first end of the bias circuit.

7. The bootstrap voltage generating circuit of claim 1, wherein the low voltage reference potential is ground.

8. A bootstrap voltage generating circuit for generating a bootstrap voltage on a load circuit having a load capacitance, wherein the bootstrap voltage generating circuit comprises:
- a current source for providing a current;
- a bias circuit receiving the current, wherein the bias circuit has a first end, and a second end connected to a reference potential, and wherein a voltage at the first end of the bias voltage is a function of a resistance of a resistive device, and wherein the bias circuit comprises a diode;
- a PMOS transistor having a source coupled to the first end of the bias circuit;
- an NMOS transistor having a drain connected to a drain of the PMOS transistor, and a gate connected to a gate of the PMOS transistor, wherein the gates of the PMOS transistor and the NMOS transistor are coupled to a clock signal;
- a charging capacitor having a first end coupled to the drains of the PMOS transistor and the NMOS transistor, and a second end coupled to the load circuit; and
- a switch circuit connected to a second end of the charging capacitor for setting a voltage at the second end of the charging capacitor, wherein the switch circuit is responsive to the clock signal, and wherein the switch circuit is configured to control the bootstrap voltage generating circuit to output a positive voltage and a negative voltage at the second end of the charging capacitor.

9. The bootstrap voltage generating circuit of claim 8, wherein the voltage at the first end of the bias voltage is not a function of a power supply voltage of the bootstrap voltage generating circuit.

10. The bootstrap voltage generating circuit of claim 8, wherein the bias circuit further comprises an additional NMOS transistor coupled in series with the resistive device, and wherein a gate and a drain of the additional NMOS transistor are interconnected, and wherein a voltage at the first end of the bias circuit is linear to a threshold voltage of the additional NMOS transistor.

11. The bootstrap voltage generating circuit of claim 8, wherein the bias circuit further comprises a diode coupled in series with the resistive device.

12. The bootstrap voltage generating circuit of claim 8 further comprising:
- an additional current source for providing an additional current;
- an additional bias circuit receiving the additional current, wherein the additional bias circuit has a first end, and a second end connected to the reference potential, and wherein a voltage at the first end of the additional bias circuit is independent from a drift of the power supply voltage of the bootstrap voltage generating circuit;
- an additional PMOS transistor having a source coupled to the first end of the additional bias circuit;
- an additional NMOS transistor having a drain connected to a drain of the additional PMOS transistor, and a gate connected to a gate of the additional PMOS transistor, wherein the gates of the additional PMOS and the additional NMOS transistor are coupled to the clock signal;
- an additional charging capacitor having a first end coupled to the drains of the additional PMOS transistor and the additional NMOS transistor; and
- an additional switch circuit connected to a second end of the additional charging capacitor for setting an additional voltage at the second end of the additional charging capacitor, wherein the additional switch circuit is responsive to an inversed phase of the clock signal, and wherein the voltage set by the switch circuit is the power supply voltage, and the additional voltage set by the additional switch circuit is the reference potential.

13. The bootstrap voltage generating circuit of claim 8, wherein the current source is coupled between the first end of the bias circuit and an operation voltage of the bootstrap voltage generating circuit, and wherein a drain of the NMOS transistor is connected to the reference potential.

* * * * *